(12) United States Patent
Chan et al.

(10) Patent No.: US 7,173,875 B2
(45) Date of Patent: Feb. 6, 2007

(54) SRAM ARRAY WITH IMPROVED CELL STABILITY

(75) Inventors: Yuen H. Chan, Poughkeepsie, NY (US); Rajiv V. Joshi, Yorktown Heights, NY (US); Donald W. Plass, Pleasent Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 10/950,928

(22) Filed: Sep. 27, 2004

(65) Prior Publication Data

US 2005/0078508 A1 Apr. 14, 2005

Related U.S. Application Data

(63) Continuation-in-part of application No. 10/306,938, filed on Nov. 29, 2002, now Pat. No. 6,798,688, and a continuation-in-part of application No. 10/307,168, filed on Nov. 29, 2002, now Pat. No. 6,798,682.

(51) Int. Cl.
*G11C 8/00* (2006.01)
*G11C 11/00* (2006.01)

(52) U.S. Cl. .................................. 365/230.06; 365/156
(58) Field of Classification Search ................ 365/154, 365/156, 189.05, 230.06, 63, 230.08, 194, 365/233
See application file for complete search history.

(56) References Cited

U.S. PATENT DOCUMENTS

| | | | | |
|---|---|---|---|---|
| 6,791,864 B2 * | 9/2004 | Houston | ..................... | 365/154 |
| 6,798,682 B2 * | 9/2004 | Chuang et al. | ................ | 365/63 |
| 6,798,688 B2 * | 9/2004 | Joshi | .......................... | 365/154 |
| 6,868,000 B2 * | 3/2005 | Chan et al. | ................. | 365/154 |
| 6,914,803 B2 * | 7/2005 | Yamaoka et al. | ........... | 365/154 |
| 6,990,038 B1 * | 1/2006 | Chan et al. | ............ | 365/230.06 |
| 7,006,403 B2 * | 2/2006 | Joshi et al. | ............ | 365/230.06 |

\* cited by examiner

*Primary Examiner*—Trong Phan
(74) *Attorney, Agent, or Firm*—Law Office of Charles W. Peterson, Jr.; Louis J. Percello, Esq.; Rafael Perez-Pineiro, Esq.

(57) ABSTRACT

A CMOS static random access memory (SRAM) cell array, an integrated chip including the array and a method of accessing cells in the array with improved cell stability. Bit lines connected to half selected cells in the array are floated during cell accesses for improved cell stability.

38 Claims, 6 Drawing Sheets

SRAM ARRAY WITH IMPROVED CELL STABILITY

CROSS REFERENCE TO RELATED APPLICATION

The present invention is a continuation in part of U.S. patent application Ser. No. 10/306,938, now U.S. Pat. No. 6,798,688 entitled "Storage Array Such As A SRAM with Reduced Power Requirements" to Joshi, and U.S. application Ser. No. 10/307,168 now U.S. Pat. No. 6,798,682 entitled "Reduced Integrated Circuit Chip Leakage and Method of Reducing Chip Leakage" to Chuang et al., both filed Nov. 29, 2002 and published Jun. 3, 2004 and assigned to the assignee of the present invention.

FIELD OF THE INVENTION

The present invention is related to improving static random access memory (SRAM) stability and more particularly to improving SRAM half select stability.

BACKGROUND DESCRIPTION

Integrated circuits (ICs) are commonly made in the well-known complementary insulated gate field effect transistor (FET) technology known as CMOS. CMOS technology and chip manufacturing advances have resulted in a steady decrease of chip feature size to increase on-chip circuit switching frequency (circuit performance) and the number of transistors (circuit density). In what is typically referred to as scaling, device or field effect transistor (FET) features are shrunk to shrink corresponding device minimum dimensions including both horizontal dimensions (e.g., minimum channel length) and vertical dimensions, e.g., channel layer depth, gate dielectric thickness, junction depths and etc. Shrinking device size increases device density and device performance, as well as reduces device operating conditions, i.e., chip and correspondingly, device supply voltages and voltage swings. Consequently, as a result of scaling otherwise seemingly neglectable device variations have caused serious design problems, especially in signal critical circuits such as memory cells and sense amplifiers.

A typical CMOS circuit, for example, includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa. For example, a CMOS inverter is a series connected PFET and NFET pair that are connected between a power supply voltage (Vdd) and ground (GND).

A typical static random access memory (SRAM) cell, ideally includes a balanced pair of cross coupled inverters storing a single data bit. A pair of pass gates (also ideally, a balanced pair of FETs) selectively connect the complementary outputs of the cross coupled inverter to a corresponding complementary pair of bit lines. A word line connected to the gates of the pass gate FETs selects connecting the cell to the corresponding complementary pair of bit lines. Normally, an N row by M column SRAM array is organized as N word lines by M column lines. Each column line includes one or more (K) bit line pairs that, in standby are clamped together and to a supply or reference voltage. Accessing Kbits (for a read or a write) from array entails driving one of the N word lines, turning on the pass gates for all M by K cells on that word line. With the pass gates on for that selected word line, the cross coupled cell inverters are coupled to the corresponding bit line pairs, partially selecting the M by K cells (half selected) on that word line. Selection of one of the M columns selects the K cells on that word line, the Kbits actually being accessed. The remaining (M−1) by K bits remain half selected during the access.

During a read, each cell on the selected word line couples its contents to its corresponding bit line pair such that each of the bit line pairs may rise/droop, usually, only to develop a small difference signal (e.g., 50 mV). While the bit line pairs in the selected K columns are unclamped and coupled to a sense amplifier, the half selected cells remain clamped together and to the reference voltage. At some point after sensing data for the selected K selected bits, the word line returns low again, deselecting/isolating the M by K cells on that word line. As long as the word line remains high, however, pass gates in half selected cells couple the reference voltage onto both storage nodes in each half selected cell. Depending upon the length of time that the word line remains high, the pass gates couple the partially selected cells tend toward an equilibrium point with the outputs of both of the cross coupled inverters (i.e., the storage nodes) being pulled toward a common voltage. This is normally a measure of cell stability, i.e., selecting the cell and clamping the bit lines to a voltage and noting the point at which the cell becomes meta-stable or switches, i.e., is upset. Unfortunately, imbalances in cell devices can upset half selected cells or at the very least to become meta-stable at normal design voltages. This instability is intolerable.

This instability may be worse still in a partially depleted (PD) silicon on insulator (SOI) CMOS SRAM cell, which is subject to what is known as floating body effects. Floating body effects, also known simply as body effects or as history effects, occur in completely or partially isolated devices, especially in analog logic circuit FETs, memory devices (FETs) or in logic where device body contacts may be infrequent or eliminated. As a particular device switches off, charge (i.e., majority carriers) remains in the device body beneath the channel. Device leakage and parasitic bipolar effects may add to the charge. Charge builds at isolated locations as the chip operates because the charge from fast switching devices is injected into locally isolated body pockets faster than it dissipates. Eventually, the injected charge reaches some steady state value that acts as a substrate bias, e.g., shifting the threshold voltage ($V_T$) for the device. This steady state change depends upon each particular device's switching history and so is also known as the history effects for the particular device. So, body effects may cause two adjacent devices that are identical by design and measured to be identical to exhibit some difference, difference that may be time varying from changing circuit conditions, e.g., during read and write operations. Thus, the initial states of cell transistors (cell history) as well as gate-to-body tunneling current (that may further imbalance cell symmetry) can be critical to cell stability.

Thus, there is a need for improved SRAM cell stability, especially for PD SOI CMOS SRAMs.

SUMMARY OF THE INVENTION

It is a purpose of the invention to improve RAM data reliability;

It is another purpose of the invention to reduce the opportunity for cell upsets in half selected SRAM cells;

It is yet another purpose of the invention to reduce cell upsets in half selected SRAM cells for improved PD SOI CMOS SRAM stability.

The present invention relates to a storage array such as a CMOS static random access memory (SRAM) cell array, an integrated chip including the array and a method of accessing cells in the array with improved cell stability. Bit lines connected to half selected cells in the array are floated during cell accesses for improved cell stability.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
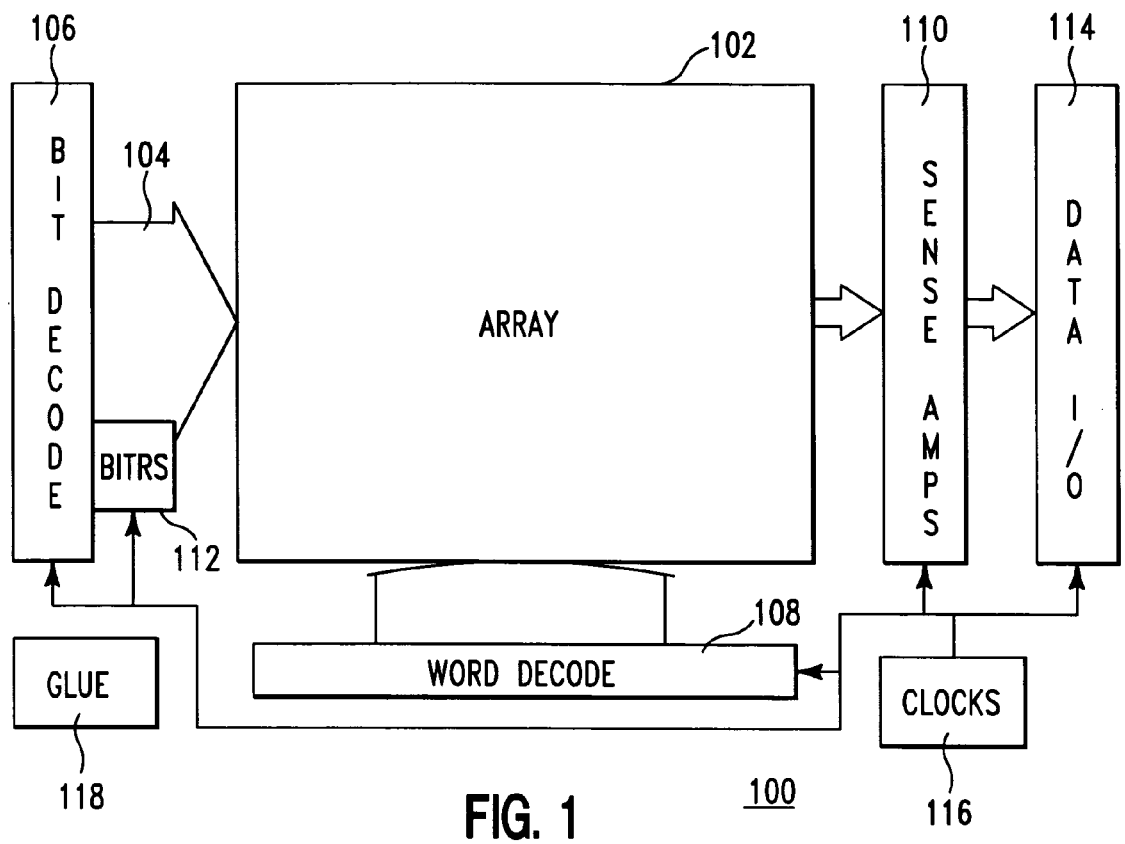
FIG. 1 shows an example of an array of CMOS static random access memory (SRAM) cells, with a column restore that pulses half selected columns to reduce the potential for cell upsets to improve array stability according to a preferred embodiment of the present invention.

Turning now to the drawings and, more particularly, FIG. 1 shows a storage circuit 100 (e.g., memory), macro or chip, in the insulated gate technology known as CMOS, and more particularly, an array 102, subarray or array of subarrays of CMOS static random access memory (SRAM) cells. A column select 104 to the array 102 includes column restores that are pulsed off to float array columns when at least one column is being accessed to reduce the potential for half selected cell upsets for improved array stability according to a preferred embodiment of the present invention. While the present invention has application to improving stability in almost any array 102 of storage latches; the present invention is most advantageous to application in the any CMOS technology known as partially depleted (PD) silicon on insulator (SOI) technology that has a stated base design material or base design rule gate oxide thickness.

A bit decode circuit 106 decodes a bit address and selects one of N columns of cells in the array 102, an M by N array or subarray. A word decoder 108 selects one of M local word lines, each connected to a row of cells in the array 102. So, in this example, the array 102 is addressed by coincidence of a selected column with a selected row and cells in unselected columns on the selected row are half selected. Preferably, to keep bit line capacitance at optimum, the number of cells in each column is less than 100. The column select 104 also couples the selected cells to sense amplifiers 110 during a read to sense data stored in the selected cells. A bit restore float pulse generator 112 pulses the column restore at each column in the column select 104, to floats bit lines for half selected cells, i.e., for the duration of that pulse, preferably, which is, as long as the word decoder 108 is driving the selected word line. Data input/output (I/O) drivers 114 receive input data and drive sensed data from the sense amplifiers 110, e.g., off chip. Clock logic 118 provides local timing and glue logic 118 provides local control, e.g., read/write select, address gating and buffering, etc.

Figure 2:
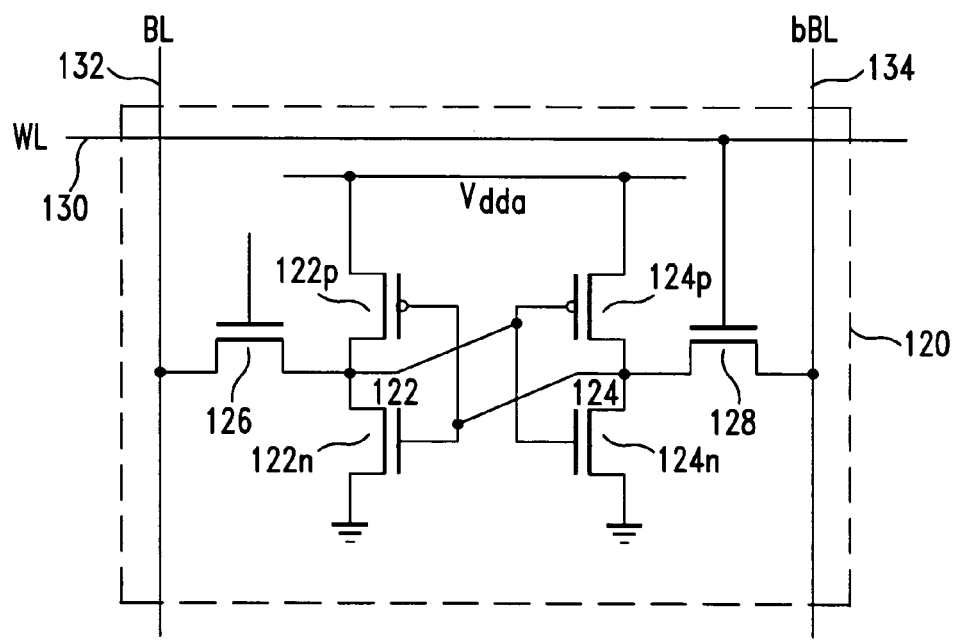
FIG. 2 shows an example of a preferred six transistor (6T) storage cell or latch from an array of such latches or cells.

FIG. 2 shows an example of a preferred six transistor (6T) storage cell 120 or latch from an array 102 of such latches or cells 120. Data is stored in the cell 120 in a pair of cross coupled inverters 122, 124 accessed through a pair of pass gate FETs 126, 128. The gates of pass gate FETs 126, 128 are connected to a word line 130 that selectively couples the cell contents to a pair of complementary bit lines 132, 134. Each word line 130 is connected to pass gates 126, 128 in a row of cells 120 and each pair of complementary bit lines (BL and bBL) 132, 134 is connected to a column of cells 120 in the array 102. Cell selection is by coincidence of a selected word line 130 with a selected bit line pair 132, 134. The cross coupled inverters 122, 124 are connected between an increased voltage (Vdda) supply line 136 and supply return or array ground 138. Preferably in this example, the NFETs 122N, 124N, 126, 128 in the cell 120 are tailored NFETs with a threshold that is higher than the typical baseline NFET in support circuits, e.g., 112, 114, 116. Additionally, word line drivers 104 include tailored FETs (preferably PFETs) driving the word lines 130. Optionally, data path circuits, e.g., 106, 108, 110 may also include selected tailored FETs. For an example of using low leakage devices, e.g., tailored FETs, in logic similar to the word line drivers 104 or data path circuits 106, 108, 110; see, U.S. patent application Ser. No. 10/644,211, entitled "Method Of Reducing Leakage Current In Sub One Volt SOI Circuits" to Richard B. Brown et al., filed Aug. 22, 2003, assigned to the assignee of the present invention and incorporated herein by reference.

Selecting the word line 130 turns on the pass gate FETs 126, 128 to selectively couple the cell contents to a pair of complementary bit lines 132, 134. Each word line 130 is connected to pass gates 126, 128 in a row of cells 120 and each pair of complementary bit lines 132, 134 is connected to a column of cells 120 in the array 102. Cell selection is by coincidence of a selected word line 130 with a selected bit line pair 132, 134. The cross coupled inverters 122, 124 are connected between an array voltage supply line and supply return or array ground. The bit line pair 132, 134 of a selected cell is floated during a read and driven to complementary levels (high and low or low and high) during a write. Previously, the bit line pairs 132, 134 were relatively large capacitive loads (e.g., several tenths of a picofarad) from connecting to a relatively large number of array rows. The columns were charged/clamped high (e.g., to $V_{dd}$) until selected and so, half selected cells 120 were biased to be in their most unstable state, enhancing the likelihood of upsets. By contrast, according to a preferred embodiment of the present invention, much shorter and so, much more lightly loaded bit line pairs 132, 134 of half selected cells are unclamped and allowed to float during every access. This allows the half selected cells to begin driving the floating bit line pair (i.e., pulling one side 132 or 134 low and allowing the other side 134, 132 to remain high) and, therefore, minimizes the likelihood of an upset.

Figure 3:
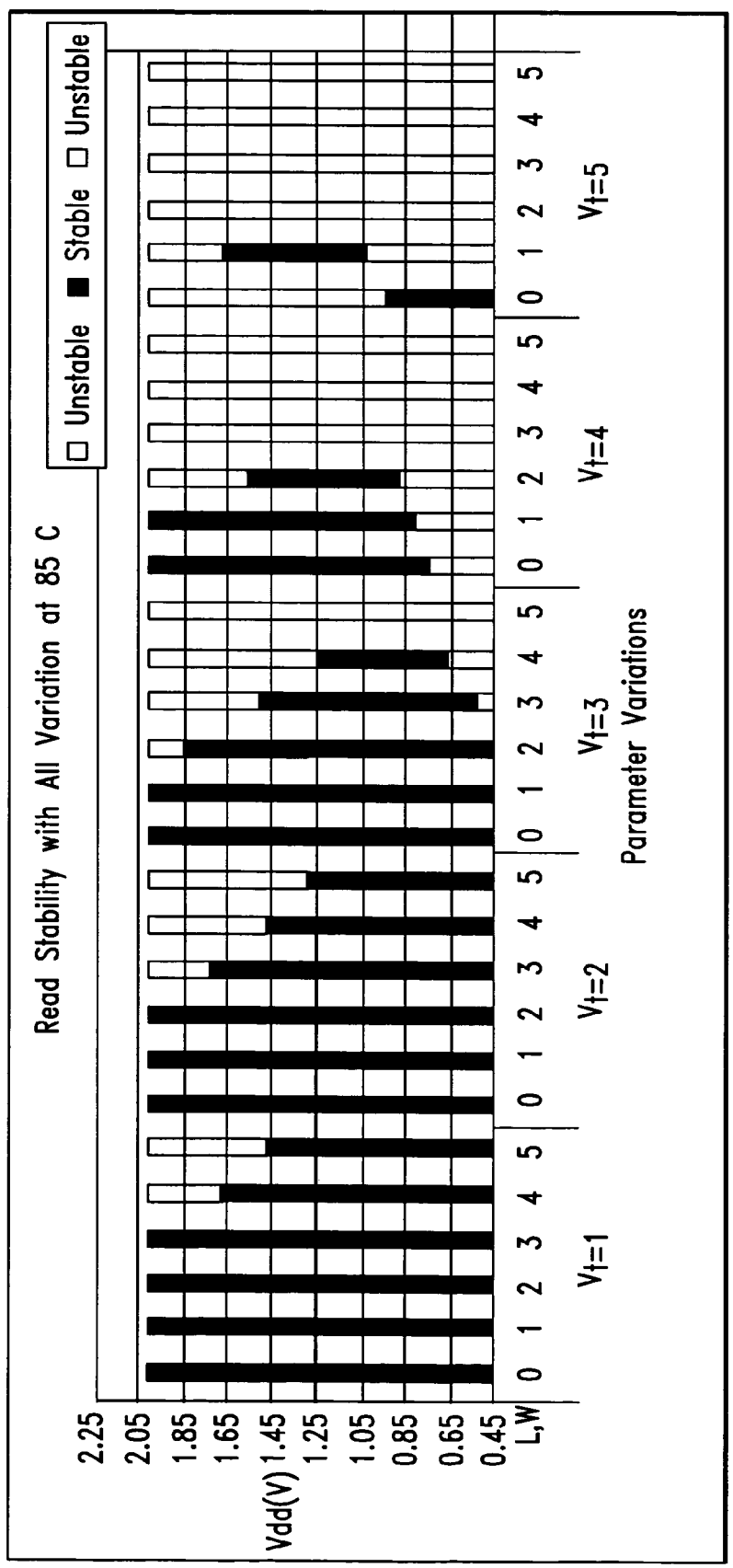
FIG. 3 shows an example of a comparison of SRAM cell stability at different fabrication process points for cells operating at 85° C. and over an array supply ($V_{dd}$), range of 0.45 Volts (0.45V) to 2.25V.

FIG. 3 shows an example of a comparison of SRAM cell stability at different fabrication process points for cells 120 operating at 85° C. and over an array supply voltage ($V_{dd}$) range of 0.45 Volts (0.45V) to 2.25V. Normal variations in the fabrication process cause variations in device length, width and threshold ($V_T$), which all determine cell stability. Accordingly, 6 different cell FET horizontal process points (width and length) are represented at each of 6 standard deviation (σ) points from nominal at the mean (0) to 5σ worst case in descending order and at five (5) different threshold standard deviation points from nominal to worst case, also in descending order. Essentially, data is written to the cells (1s and 0s); the cell word lines and bit lines 132, 134 are clamped high (i.e., half selected) for an selected period, e.g., clamped at $V_{dd}$ at least a normal read or write access; and, the cell contents are read to determine if the data has been lost. Thus, fabrication process variations exacerbate cell instability, especially for the worst case cell length and width with the worst case $V_T$, which could be considered unstable. However, floating lightly loaded bit lines for half selected cells according to the present invention, mitigates that instability.

Figure 4A:
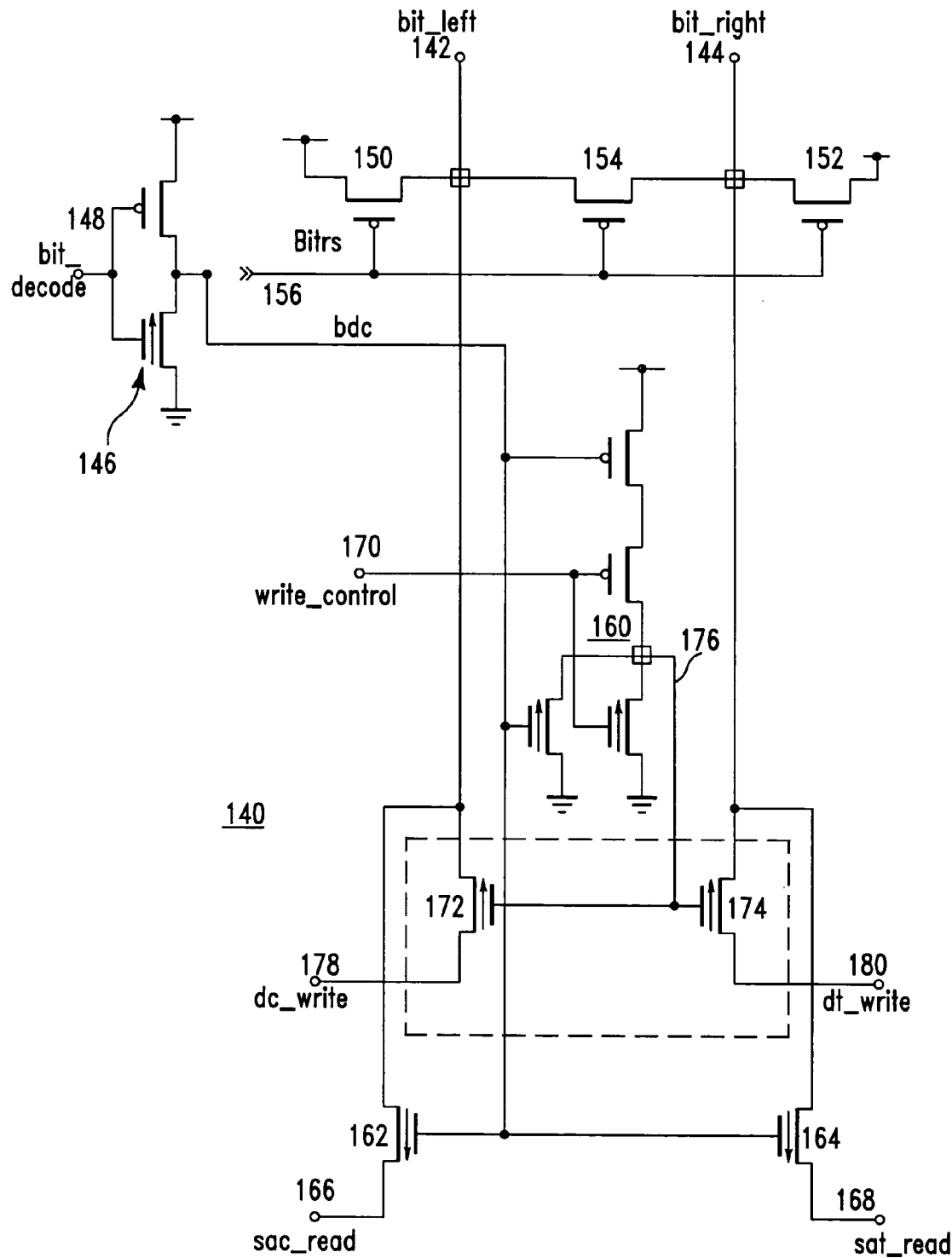
FIG. 4A shows an example of a preferred column select driver connected to cells in an array.

FIG. 4A shows an example of a preferred column select driver 140, e.g., one of N in column select 104, for a complementary bit line pair (bit left and bit right) 142, 144, connected to a number (M) of cells (not shown), each connected to one of M word lines in an M by N array 102. An inverter 146 receives a decoded column select signal 148 from the bit decode circuit (bdc) 106. A column restore at each bit line pair 142 or column include a pair of bit line pull up devices 150, 152 and an equalization device. Bit line pull up devices, PFETs 150, 152, and equalization device, PFET 154 are on during standby and pulsed off when the word line is high by a bit restore signal (Bitrs) 156, which allows the bit line pair 142, 144 to float. The output of the inverter 146 is an input to a 2 input NOR gate 160 and drives a pair of bit line select pass gates, PFETs 162, 164. PFETs 162, 164 are read pass gates and during a read, pass a complementary signal on the selected bit line pair 142, 144 to a complementary data line pair (sac read and sat read) 166, 168, respectively, that is connected to a sense amplifier (110 in FIG. 1). A write control signal (write control) 170 is a second input to the 2 input NOR gate 160. A pair of write devices, NFETs 172, 174, are driven by the output 176 of 2 input NOR gate 160. The write devices, NFETs 172, 174 selectively couple complementary input data on data write pair (dc write and dt write) 178, 180 to bit line pair 142, 144, respectively.

In a typical access, an array word line (not shown) is driven high selecting a row of cells. Simultaneously or shortly thereafter, one selected column signal 148 rises at the input to the corresponding inverter 146 and the output of the inverter 146 falls to select the column. Simultaneously, or shortly thereafter, bit restore signal 156 pulses high to turn off all of the bit line pull up devices 150, 152 and equalization device 154, which floats all of the bit line pairs 142, 144, to allow a signal to develop. The capacitive load from the bit line pairs 142, 144 is light enough that, after a number of cycles, a full signal would develop on each half selected bit line pair 142, 144. Preferably, the pulse lasts as long as the selected word line is high. For the selected column the low on bit line select pass gates 162, 164 couples the bit line pair 142, 144 to the data line pair 166, 168. During a read, the write input 170 to NOR gate 160 remains high. So, the write devices 172, 174 remain off because the output 176 of NOR gate 160 is low. During a write, the write input 170 pulses low. So, the write devices 172, 174 turn on when the output of inverter 146 falls, which drives the output of NOR gate 160 high. With the write devices 172, 174 on, data passes from data write pair 172, 174 to the bit line pair 178, 180. During both a read and a write, PFETs 150, 152 and 154 in every column are pulsed off. Since half selected cells are not clamped to $V_{dd}$ and a signal is allowed to develop on the bit line pair 142, 144, upsets are much less likely to occur even for cells with low threshold, short narrow devices.

Figure 4B:
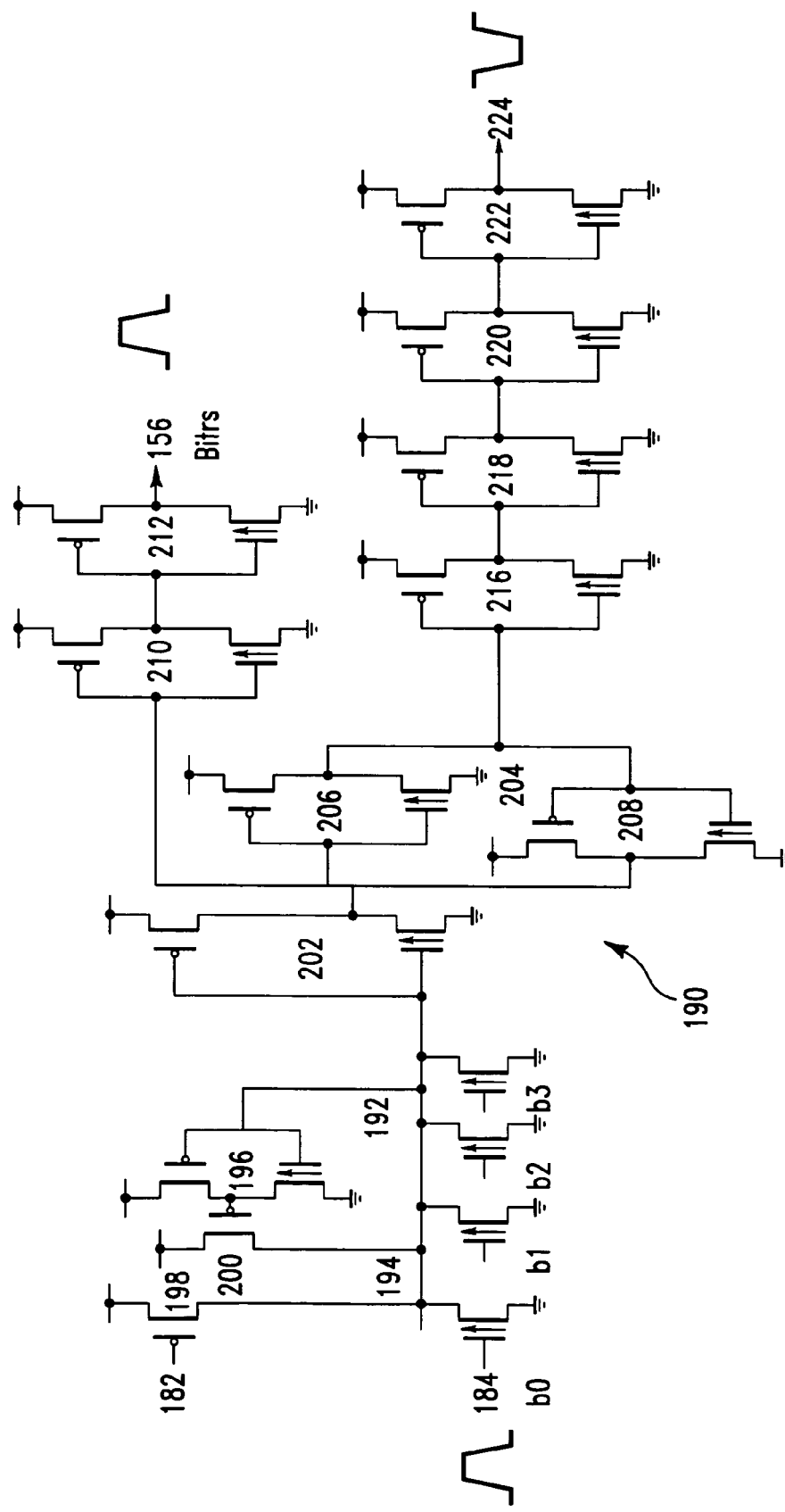
FIG. 4B shows an example of a bit restore timer.

FIG. 4B shows an example of a bit restore float pulse generator 190, e.g., 112 in the example of FIG. 1. A local clock (DELCLK) 182 from clock logic 116 and bit addresses (b0 184, b1, b2, b3) to bit decode 106 also are passed to a dynamic latch 192 that detects selection of a column. The dynamic latch 192 includes a n-way dynamic NOR gate 194, where n=$\log_2$ N, NORing n address bits 184 and an inverter 196. A reset PFET 198 gated by the clock 182, selectively resets the dynamic latch (pulling high the output of the n-way dynamic NOR gate 194 in an unaccessed subarray). An inverter 196 is cross coupled with the n-way dynamic NOR gate 194 through a clamping PFET 200. A buffer inverter 202 buffers the output of the dynamic latch 192. A pulse shaping latch 204 of cross coupled inverters 206, 208, latches the output of the buffer inverter 202. A pair of series inverters 210, 212, provides Bitrs 156 as the non-inverted delayed output of the buffer inverter 202. Four (4) series inverters 216, 218, 220, 222 provide a delayed output (RSC GLB) 224 of the inverted output of the pulse shaping latch 204.

Figure 4C:
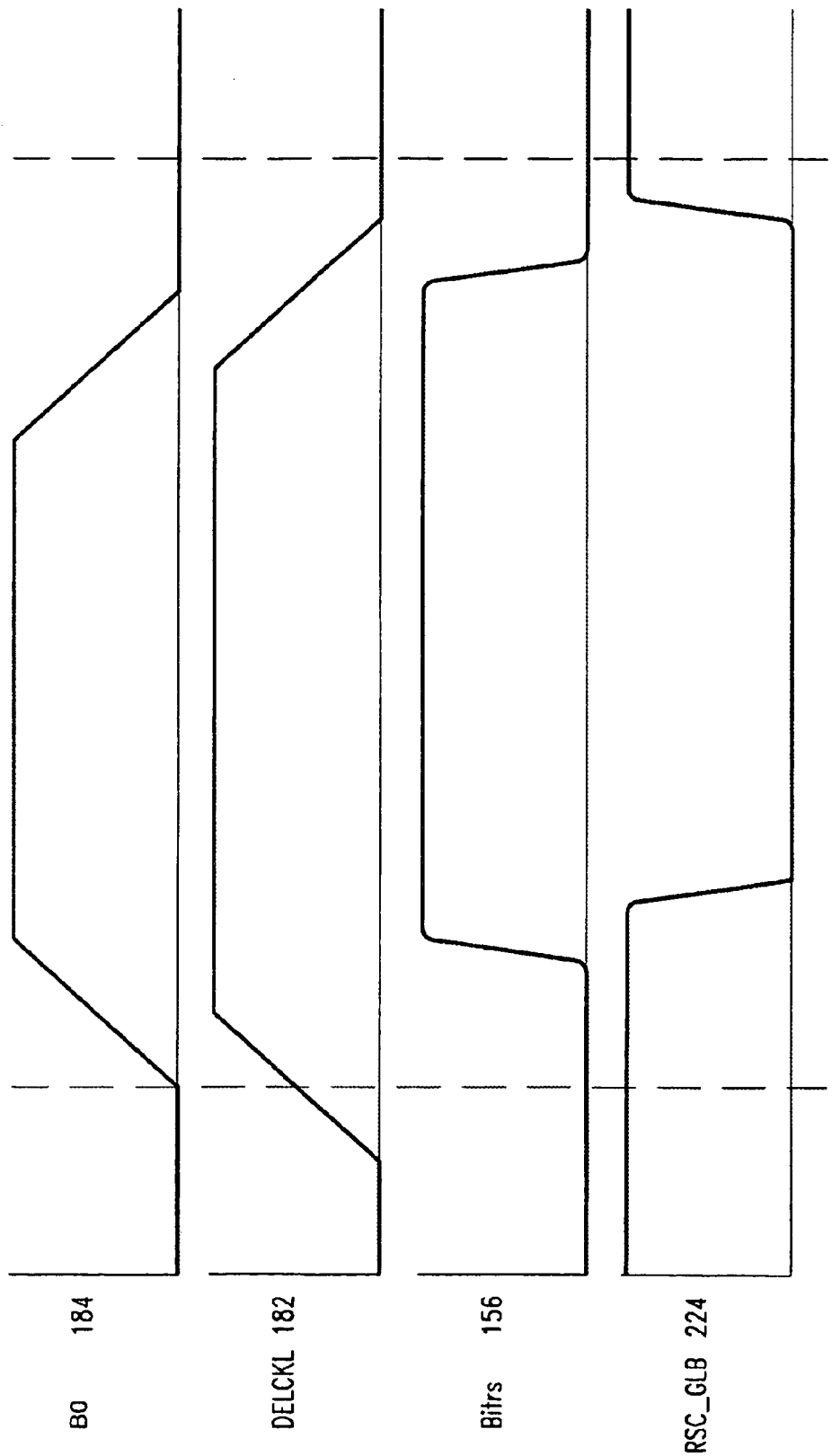
FIG. 4C shows a timing example for the bit restore timer of FIG. 4B.

FIG. 4C shows a timing example for the bit restore timer 190 of FIG. 4B. Normally, the clock (DELCLK) 182 gating the reset PFET 198 is low. So, The reset PFET 198 is on, clamping the output of the n-way NOR gate 194 high. With the output of the n-way NOR gate 194 high, the output of the buffer inverter 202 and the non-inverted delayed output (Bitrs) 156 are both low. Correspondingly, the inverted delayed output (RSC GLB) 224 is high. When the clock 182 rises, PFET 198 turns off, but the dynamic latch 192 maintains its current state, e.g., to compensate for an atypically slow access. When one or more bit addresses 184 rise, indicating that a column is being selected, the dynamic latch 192 is set and the output of the buffer inverter 202 rises. When the output of the buffer inverter 202 rises, the pulse shaping latch 104 switches states as the buffer inverter output 202 propagates through first series inverter 210. Thereafter, the non-inverted delayed output 156 rises two inverter stage delays after exiting the buffer inverter 202. Three inverter stage delays later, the inverted delayed output 224 falls. When the column selection has concluded and the high bit addresses 184 begin to fall, the dynamic latch 192 maintains its current state until the clock 182 falls. The clock falling turns on PFET 198 to reset the dynamic latch 192 and the output of the buffer inverter 202 falls. When the output of the buffer inverter 202 falls, the pulse shaping latch 104 switches states as the buffer inverter output 202 propagates through first series inverter 210. Thereafter, the non-inverted delayed output 156 falls, again two inverter stage delays after exiting the buffer inverter 202. Again, three inverter stage delays later, the inverted delayed output 224 rises.

Figure 5A:
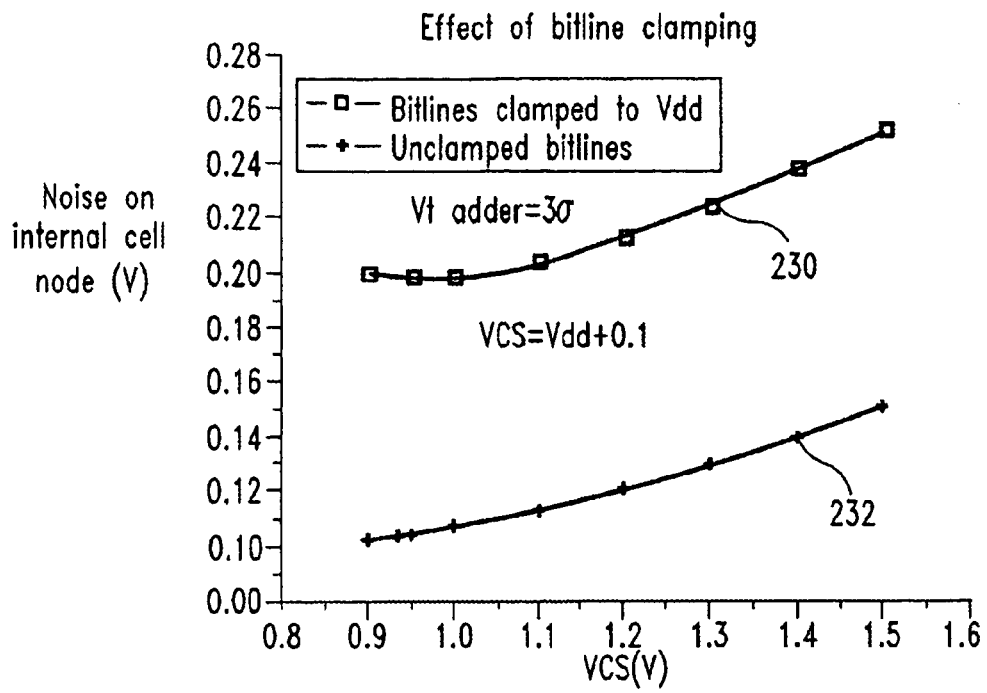
FIGS. 5A–B show the improved cell stability for a preferred embodiment SRAM with the cell $V_T$ at 3σ worst case and the supply elevated to 0.1V above nominal.
Figure 5B:
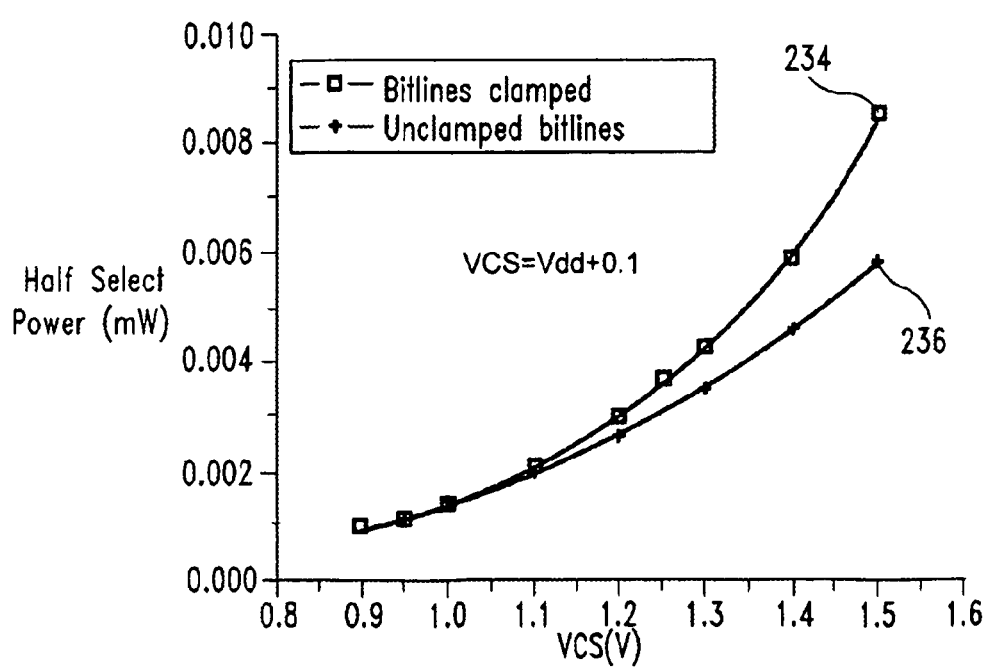

FIGS. 5A–B show the improved cell stability for a preferred embodiment SRAM with the cell $V_T$ at 3σ worst case ($V_T$ adder=3σ) and the supply (VCS(V)) elevated to 0.1V above nominal, i.e., at VCS=$V_{dd}$+0.1. FIG. 5A shows the Effect of bitline clamping in a comparison of internal cell noise, e.g., in cell 120 of FIG. 2, i.e., on the internal storage nodes both with the bit lines 132, 134 clamped 230 to $V_{dd}$, and, unclamped 232 according to a preferred embodiment of the present invention. Advantageously, unclamping the bit lines 132, 134 for the half selected cell dramatically reduces internal cell noise. FIG. 5B shows a cell half select power comparison for same cell 120, with bit lines 132, 134 clamped 234 and, unclamped 236 according to a preferred embodiment of the present invention. Advantageously, half selected cells pulsed unclamped 234 deliver clear cut power savings, 5–6% per cell at 1.1 V, 85° C. in this example. Thus, pulsing the bit lines unclamped for half selected cells provides clear advantages both in power and stability for a preferred embodiment memory.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. An integrated circuit (IC) chip comprising:
    an array of storage cells arranged in rows and columns;
    a column restore attached to each of said columns, said column restore selectively clamping columns to a supply voltage;
    a row select selecting a row from amongst said rows in said array responsive to a row address, the selected said row half selecting said storage cells in said row; and
    a local column float pulse generator pulsing said column restore responsive to half selection of said row of storage cells, said column restore floating columns including said storage cells in said row.

2. An IC as in claim 1, wherein said array is a static random access memory (SRAM) array and said storage cells are SRAM cells.

3. An IC as in claim 2, wherein each said row is a row of said SRAM cells connected to a word line and each of said columns is a column of said SRAM cells connected to a complementary pair of bit lines.

4. An IC as in claim 3, wherein said IC is a CMOS IC and said column restore comprises a pair of p-type field effect transistors (PFETs) at each said column of SRAM cells and gated by said local column float pulse generator, each of said pair being connected between a corresponding one of said complementary pair of bit lines and said supply voltage.

5. A CMOS IC as in claim 4, wherein said column restore further comprises an equalizer PFET at each said column of SRAM cells, said equalizer PFET being connected between said complementary pair of bit lines and gated by said local column float pulse generator.

6. An IC as in claim 1, further comprising:
    a column select selecting one or more columns from amongst said columns, said storage cells in said selected row and in each selected one of said one or more columns being selected cells, remaining said storage cells in said selected row being half selected storage cells.

7. An IC as in claim 1, wherein said local column float pulse generator comprises:
    an access sense latch receiving an indication of an array access and latching upon a determination that an array access is indicated;
    a pulse shaper shaping an output of said access sense latch; and
    an output delay delaying the shaped said output, said output delay providing a pulse pulsing said column restore.

8. An IC as in claim 7, wherein said access sense latch is a set-reset (SR) latch, said SR latch being set responsive to said indication and being reset responsive to a local clock.

9. An IC as in claim 8, further comprising:
    a column select selecting one or more columns from amongst said columns, said storage cells in said selected row and in each selected one of said one or more columns being selected cells, remaining said storage cells in said selected row being half selected storage cells.

10. An IC as in claim 9, wherein said IC is a CMOS IC, said array is a SRAM array and said storage cells are SRAM cells, wherein each said row is a row of said SRAM cells connected to a word line and each of said columns is a column of said SRAM cells connected to a complementary pair of bit lines, said CMOS IC further comprising:
    at least one sense amplifier sensing data stored in a selected one of said cells;
    at least one input/output (I/O) driver, each said I/O driver passing written data to a selected said column and redriving sensed said data; and
    local clock logic providing said local clock.

11. A CMOS IC as in claim 10, wherein said column restore comprises:
    a pair of p-type field effect transistors (PFETs) at each said column of SRAM cells and gated by said pulse, each of said pair being connected between a corresponding one of said complementary pair of bit lines and said supply voltage; and
    an equalizer PFET at each said column of SRAM cells, connected between said complementary pair of bit lines and gated by said pulse.

12. A CMOS IC as in claim 11, wherein each of said SRAM cells comprises:
    a pair of cross-coupled inverters; and
    a pair of NFET pass gates, each connected between an output of said pair of cross-coupled inverters and a corresponding one of a pair of complementary bit lines.

13. A CMOS IC as in claim 12, wherein said IC is on a partially depleted (PD) silicon on insulator (SOI) chip.

14. A CMOS IC as in claim 13, wherein said SRAM array includes less than 100 of SRAM cells in each of said columns.

15. A CMOS integrated circuit (IC) chip including an static random access memory (SRAM) array of SRAM cells arranged in rows and columns, said SRAM array comprising:
    a column restore attached to each of said columns, said column restore selectively clamping columns to a supply voltage;
    a row select selecting a row from amongst said rows in said SRAM array responsive to a row address, the selected said row half selecting said SRAM cells in said row;
    a column select selecting one or more columns from amongst said columns, said SRAM cells in said selected row and in each selected one of said one or more columns being selected cells, remaining said SRAM cells in said selected row being half selected cells; and
    a local column float pulse generator pulsing said column restore responsive to half selection of said selected row of storage cells, said column restore floating columns including said half selected cells.

16. A CMOS IC as in claim 15, wherein each said row is a row of said SRAM cells connected to a word line and each of said columns is a column of said SRAM cells connected to a complementary pair of bit lines.

17. A CMOS IC as in claim 16, wherein said column restore comprises a pair of p-type field effect transistors (PFETs) at each said column of SRAM cells and gated by said local column float pulse generator, each of said pair being connected between a corresponding one of said complementary pair of bit lines and said supply voltage.

18. A CMOS IC as in claim 17, wherein said column restore further comprises an equalizer PFET at each said column of SRAM cells, connected between said complementary pair of bit lines and gated by said local column float pulse generator.

19. A CMOS IC as in claim 18, wherein said local column float pulse generator comprises:
   an access sense latch receiving an indication of an array access and latching upon a determination that an array access is indicated;
   a pulse shaper shaping an output of said access sense latch; and
   an output delay delaying the shaped said output, said output delay providing a pulse pulsing said column restore.

20. A CMOS IC as in claim 19, wherein said select sense latch is a set-reset (SR) latch, said SR latch being set responsive to said indication and being reset responsive to a local clock.

21. A CMOS IC as in claim 20, further comprising:
   at least one sense amplifier sensing data stored in a selected one of said cells;
   at least one input/output (I/O) driver, each said I/O driver passing written data to a selected said column and redriving sensed said data; and
   local clock logic providing said local clock.

22. A CMOS IC as in claim 21, wherein each of said SRAM cells comprises:
   a pair of cross-coupled inverters; and
   a pair of NFET pass gates, each connected between an output of said pair of cross-coupled inverters and a corresponding one of a pair of complementary bit lines.

23. A CMOS IC as in claim 22, wherein said IC is on a partially depleted (PD) silicon on insulator (SOI) chip.

24. A CMOS IC as in claim 23, wherein said SRAM array includes less than 100 SRAM cells in each of said columns.

25. A CMOS static random access memory (SRAM) comprising:
   an array of SRAM cells arranged in rows and columns, a word line being connected to each of said rows of said SRAM cells and a complementary pair of bit lines being connected to each of said columns of said SRAM cells;
   a pair of bit line restore p-type field effect transistors (PFETs) connected to each said complementary pair of bit lines in each of said columns, said pair of PFETs selectively clamping said complementary pair of bit lines to a supply voltage;
   a row select selecting a row from amongst said rows responsive to a row address, the selected said row half selecting said SRAM cells in the selected said row;
   a column select selecting one or more columns from amongst said columns, said SRAM cells in said selected row and in each selected one of said one or more columns being selected cells, remaining said SRAM cells in said selected row being half selected cells; and
   a local column float pulse generator pulsing pairs of said bit line restore PFETs off responsive to half selection of said row of storage cells, off said pairs of said bit line restore PFETs floating said half selected cells.

26. A CMOS SRAM array as in claim 25, further comprising an equalizer PFET at each said column of SRAM cells, connected between said complementary pair of bit lines and gated by said local column float pulse generator.

27. A CMOS SRAM array as in claim 26, wherein said CMOS SRAM array is on a partially depleted (PD) silicon on insulator (SOI) chip.

28. A CMOS SRAM array as in claim 27, wherein said local column float pulse generator comprises:
   an access sense latch receiving an indication of an array access and latching upon a determination that an array access is indicated;
   a pulse shaper shaping an output of said access sense latch; and
   an output delay delaying the shaped said output, said output delay providing a pulse pulsing said column restore.

29. A CMOS SRAM array as in claim 28, wherein said select sense latch is a set-reset (SR) latch, said SR latch being set responsive to said indication and being reset responsive to a local clock.

30. A CMOS SRAM array as in claim 29, wherein each of said SRAM cells comprises:
   a pair of cross-coupled inverters; and
   a pair of NFET pass gates, each connected between an output of said pair of cross-coupled inverters and a corresponding one of a pair of complementary bit lines.

31. A CMOS SRAM array as in claim 30, wherein said SRAM array includes less than 100 of said SRAM cells in each of said columns.

32. A CMOS SRAM array as in claim 31, further comprising:
   at least one sense amplifier sensing data stored in a selected one of said cells;
   at least one input/output (I/O) driver, each said I/O driver passing written data to a selected said column and redriving sensed said data; and
   local clock logic providing said local clock.

33. A method of accessing data stored in a storage array said method comprising the steps of:
   a) selecting a row of cells in a storage array;
   b) selecting at least one column intersecting the selected said row; and
   c) floating unselected columns intersecting said selected row, half selected cells being connected to floated said unselected columns.

34. A method of accessing data stored in a storage array as in claim 33, wherein said storage array is an array of random access memory (RAM) cells arranged in rows and columns, before the step (a) of selecting said row said method further comprising the step of:
   a1) clamping said columns to a supply line.

35. A method of accessing data stored in a storage array as in claim 34, wherein said array of RAM cells is a static RAM (SRAM) array and each of said rows intersects a plurality of said columns, and clamping said columns in the step (a1) comprises turning on clamping devices in each of said columns and floating said columns in step (c) comprises turning off said clamping devices in said plurality of columns intersecting a selected said row.

36. A method of accessing data stored in a storage array as in claim 35, wherein said SRAM array is a CMOS SRAM array, said clamping devices are p-type field effect transistors (PFETs) and selectively clamping and floating said columns in the steps (a1) and (c) comprises lowering and raising the gate of said clamping PFETs, respectively.

37. A method of accessing data stored in a storage array as in claim 36, wherein said gate of said clamping PFETs are lowered responsive to a local clock and raised responsive to a local address.

38. A method of accessing data stored in a storage array as in claim 37, wherein the address of the intersection of said selected row and said selected column includes said local address.

* * * * *